(12) United States Patent
Shiokawa

(10) Patent No.: US 11,316,492 B2
(45) Date of Patent: Apr. 26, 2022

(54) BALUN

(71) Applicant: Murata Manufacturing Co., Ltd., Nagaokakyo (JP)

(72) Inventor: Noboru Shiokawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 50 days.

(21) Appl. No.: 17/020,866

(22) Filed: Sep. 15, 2020

(65) Prior Publication Data

US 2020/0412323 A1  Dec. 31, 2020

Related U.S. Application Data

(63) Continuation of application No. PCT/JP2019/016770, filed on Apr. 19, 2019.

(30) Foreign Application Priority Data

Apr. 23, 2018  (JP) .............................. JP2018-082623

(51) Int. Cl.
  *H03H 7/42* (2006.01)
  *H03H 7/01* (2006.01)
  *H01F 27/28* (2006.01)
  *H01G 4/30* (2006.01)
  *H03H 1/00* (2006.01)

(52) U.S. Cl.
  CPC .......... *H03H 7/42* (2013.01); *H01F 27/2804* (2013.01); *H01G 4/30* (2013.01); *H03H 7/0115* (2013.01); *H01F 2027/2809* (2013.01); *H03H 2001/0085* (2013.01)

(58) Field of Classification Search
  CPC ......... H03H 7/0115; H03H 2001/0085; H03H 7/427; H03H 7/42
  USPC ........................................ 333/175, 177, 185
  See application file for complete search history.

(56) References Cited

U.S. PATENT DOCUMENTS

| | | |
|---|---|---|
| 2005/0168300 A1 | 8/2005 | Inoue et al. |
| 2009/0079516 A1 | 3/2009 | Miyata et al. |
| 2018/0234073 A1 | 8/2018 | Taniguchi |

FOREIGN PATENT DOCUMENTS

| | | |
|---|---|---|
| JP | 2005-101944 A | 4/2005 |
| JP | 2005-192189 A | 7/2005 |
| JP | 2006-229464 A | 8/2006 |
| WO | 2017/068898 A1 | 4/2017 |

OTHER PUBLICATIONS

Official Communication issued in International Patent Application No. PCT/JP2019/016770, dated Jun. 18, 2019.

*Primary Examiner* — Rakesh B Patel
(74) *Attorney, Agent, or Firm* — Keating & Bennett, LLP

(57) ABSTRACT

A balun includes a first capacitor, a second capacitor, a first inductor, an unbalanced signal port, a first balanced signal port, and a second balanced signal port. The first capacitor and the second capacitor are electrically connected in series between the unbalanced signal port and the first balanced signal port. The first inductor is electrically connected in parallel to the first capacitor and the second capacitor electrically connected in series. A second signal path is electrically connected to a first signal path between the first capacitor and the second capacitor, and the second balanced signal port is electrically connected to the second signal path.

17 Claims, 10 Drawing Sheets

BALUN

CROSS REFERENCE TO RELATED APPLICATIONS

This application claims the benefit of priority to Japanese Patent Application No. 2018-082623 filed on Apr. 23, 2018 and is a Continuation Application of PCT Application No. PCT/JP2019/016770 filed on Apr. 19, 2019. The entire contents of each application are hereby incorporated herein by reference.

BACKGROUND OF THE INVENTION

1. Field of the Invention

The present invention relates to a balun.

2. Description of the Related Art

A balun including a multilayer body that includes a dielectric layer, a pattern conductor, and a via conductor has been known. A capacitor and an inductor are formed in the multilayer body by using the dielectric layer and at least one of the above conductors. An example of such a balun is described in Japanese Unexamined Patent Application Publication No. 2006-229464.

FIG. 11 is an equivalent circuit diagram of a balun 200 described in Japanese Unexamined Patent Application Publication No. 2006-229464. Between an unbalanced signal port PO201 and a first balanced signal port PO202, a capacitor C203 and an inductor L201 are connected in series. The inductor L201 is connected in parallel with a capacitor C201. Further, a capacitor C209 is connected between the first balanced signal port PO202 and the ground.

Between the unbalanced signal port PO201 and a second balanced signal port PO203, the capacitor C203, the inductor L201, and an inductor L206 are connected in series. Further, a capacitor C210 is connected between the second balanced signal port PO203 and the ground.

FIG. 12 is an exploded perspective view of the balun 200. The inductor L206 includes pattern conductors P201 to P205 and via conductors (illustrated by dotted lines) connecting the pattern conductors to each other, and is formed such that a winding axis is in parallel to the lamination direction of the multilayer body. Further, the inductor L201 includes pattern conductors P206 to P210 and via conductors (illustrated by dotted lines) connecting the pattern conductors to each other, and is formed similarly to the inductor L206.

When two inductors overlap each other when viewed from the lamination direction of the multilayer body, electromagnetic-field coupling between the two inductors is strong. On the other hand, in the balun 200, as illustrated in FIG. 12, the inductor L201 and the inductor L206 are disposed adjacent to each other in the multilayer body. In this case, the electromagnetic-field coupling between the inductor L201 and the inductor L206 is weak. Therefore, the influence of electromagnetic-field coupling on insertion loss of the balun 200 is small.

However, when the balun 200 illustrated in FIG. 12 is mounted on a circuit board of an electronic device, an occupying area (hereinafter, referred to as a mounting area) of the balun 200 on the circuit board may increase.

SUMMARY OF THE INVENTION

Preferred embodiments of the present invention provide baluns that are each able to significantly reduce or prevent an increase in a mounting area while also significantly reducing or preventing an increase in insertion loss.

In the baluns according to the preferred embodiments of the present invention, a significant improvement in the circuitry is provided.

A balun according to a preferred embodiment of the present invention includes a first capacitor, a second capacitor, a first inductor, an unbalanced signal port, a first balanced signal port, and a second balanced signal port. Between the unbalanced signal port and the first balanced signal port, the first capacitor and the second capacitor are electrically connected in series, and the first inductor is electrically connected in parallel to the first capacitor and the second capacitor electrically connected in series. The second balanced signal port is electrically connected to a node between the first capacitor and the second capacitor.

The baluns according to preferred embodiments of the present in invention are each able to be significantly reduce or prevent an increase in a mounting area while also significantly reducing or preventing an increase in insertion loss.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
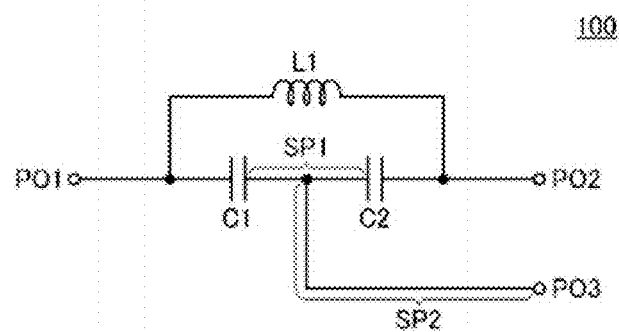
FIG. 1 is an equivalent circuit diagram of a balun 100 according to a first preferred embodiment of the present invention.

Features of the present invention are described with reference to the accompanying drawings, based on preferred embodiments of the present invention. In the following preferred embodiments, the same, similar, or common portions are denoted by the same reference signs in the drawings, and the description thereof may not be repeated in some cases.

Exploded perspective views, which are described below, are schematic views. For example, thicknesses of a dielectric layer and a pattern conductor, a diameter of a via conductor, and the like are schematic. In addition, variations in the shape of each of the elements generated in the manufacturing process are not necessarily shown in each drawing. That is, the drawings provided for the description herein represent the actual product even when there is a portion different from the actual product.

First Preferred Embodiment of Balun

A balun 100 according to a first preferred embodiment of the present invention, is described with reference to FIG. 1 to FIGS. 8A and 8B.

FIG. 1 is an equivalent circuit diagram of the balun 100. The balun 100 includes a first capacitor C1, a second capacitor C2, a first inductor L1, an unbalanced signal port PO1, a first balanced signal port PO2, and a second balanced signal port PO3.

Between the unbalanced signal port PO1 and the first balanced signal port PO2, the first capacitor C1 and the second capacitor C2 are electrically connected in series. In addition, the first inductor L1 is electrically connected in parallel to the first capacitor C1 and the second capacitor C2 electrically connected in series. The second balanced signal port PO3 is electrically connected to a node between the first capacitor and the second capacitor.

Figure 2:
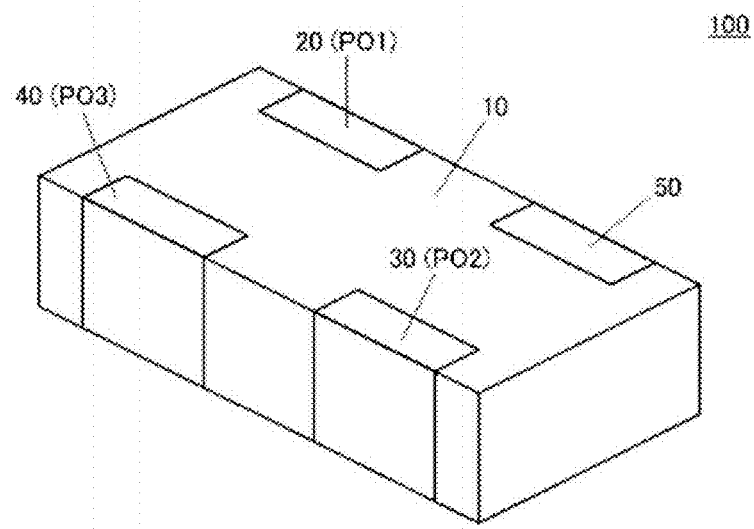
FIG. 2 is an external perspective view of the balun 100.

FIG. 2 is an external perspective view of the balun 100. The balun 100 includes a multilayer body 10, a first outer electrode 20, a second outer electrode 30, a third outer electrode 40, and a fourth outer electrode 50. The multilayer body 10 has a rectangular parallelepiped or substantially rectangular parallelepiped shape, for example. However, the shape of the multilayer body 10 is not limited thereto.

The first outer electrode 20 is provided on a first principal surface (the upper surface side in FIG. 2), a first side surface (the far side in FIG. 2) in a longitudinal direction, and a second principal surface (the bottom surface side in FIG. 2) of the multilayer body 10. The third outer electrode 40 is provided on the first principal surface, a second side surface (the front side in FIG. 2) in the longitudinal direction, and the second principal surface of the multilayer body 10 and faces the first outer electrode 20.

The second outer electrode 30 is provided on the first principal surface, the second side surface in the longitudinal direction, and the second principal surface of the multilayer body 10 and is located at a distance from the third outer electrode 40. The fourth outer electrode 50 is provided on the first principal surface, the first side surface in the longitudinal direction, and the second principal surface of the multilayer body 10, faces the second outer electrode 30, and is located at a distance from the first outer electrode 20.

Each of the first outer electrode 20, the second outer electrode 30, the third outer electrode 40, and the fourth outer electrode 50 has, for example, an angular C-shape, and has the same or substantially the same shape, except for an error at the time of formation. However, the shape of the respective outer electrodes is not limited thereto.

The first outer electrode 20 is an unbalanced signal electrode corresponding to the unbalanced signal port PO1 in the equivalent circuit diagram of the balun 100 shown in FIG. 1. The second outer electrode 30 is a first balanced signal electrode corresponding to the first balanced signal port PO2 in the equivalent circuit diagram shown in FIG. 1. The third outer electrode 40 is a second balanced signal electrode corresponding to the second balanced signal port PO3 in the equivalent circuit diagram shown in FIG. 1. In the balun 100, the fourth outer electrode 50 is a dummy electrode that is not electrically connected to a circuit provided in the multilayer body 10.

The fourth outer electrode 50 may be a ground electrode to ground the circuit provided in the multilayer body 10. Accordingly, an inductor, a capacitor, or the like, for example, that provides impedance matching or the like may be further added to the circuit provided in the multilayer body 10.

Figure 3:
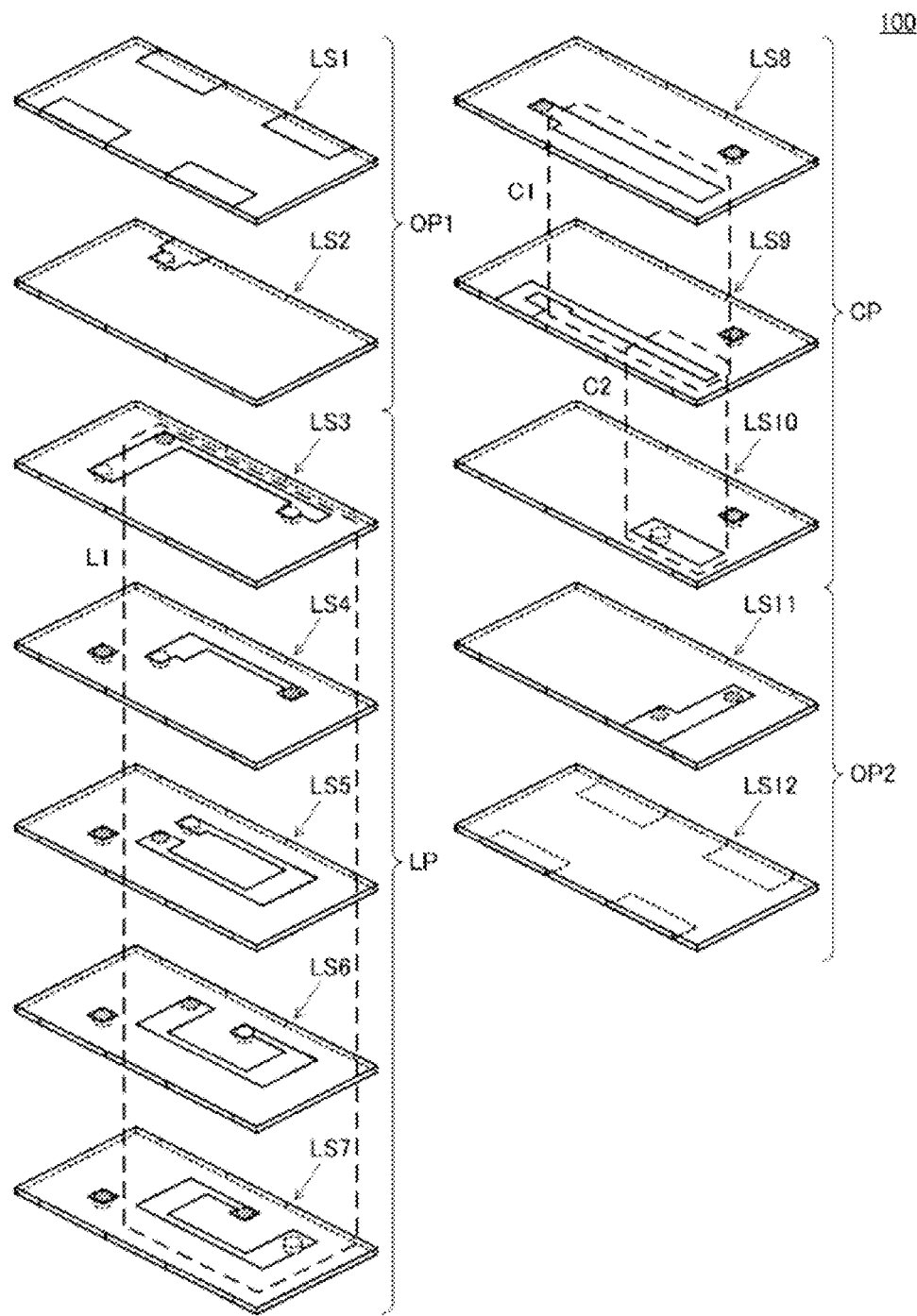
FIG. 3 is an exploded perspective view of the balun 100.

FIG. 3 is an exploded perspective view of the balun 100. The balun 100 includes layers LS1 to LS12. The layer LS1 and the layer LS2 define a first outer layer portion OP1. The layers LS3 to LS7 define an inductor portion LP including the elements of the first inductor L1 in the above-described equivalent circuit diagram.

The layers LS8 to LS10 define a capacitor portion CP including respective elements defining the first capacitor C1 and the second capacitor C2 in the equivalent circuit diagram described above. The layer LS11 and the layer LS12 define a second outer layer portion OP2.

The balun 100 includes the multilayer body 10 in which dielectric layers are laminated, pattern conductors are provided between the dielectric layers, and via conductors extend through the dielectric layers. In other words, the multilayer body 10 is integrated. However, the layers LS2 to LS11 are shown, for ease of description, as being provided by arranging a pattern conductor on the first principal surface (the upper surface side in the figure) of each of the dielectric layers.

Figure 4:
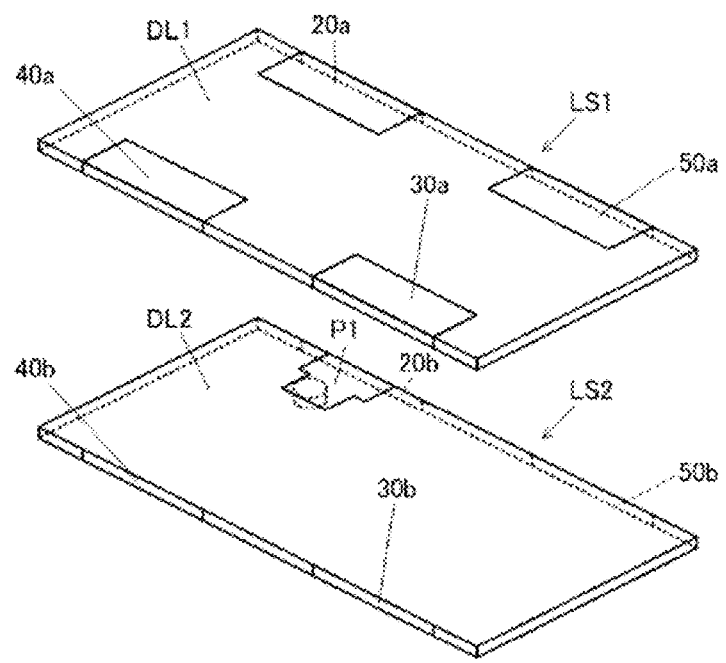
FIG. 4 is an exploded perspective view of a first outer layer portion OP1 of the balun 100.

FIG. 4 is an exploded perspective view (layer LS1 and layer LS2) of the first outer layer portion OP1 of the balun 100. On the layer LS1, an outer electrode conductor 20a, an outer electrode conductor 30a, an outer electrode conductor 40a, and an outer electrode conductor 50a are provided on the first principal surface and the side surfaces of a dielectric layer DL1. The outer electrode conductor 20a is provided at a position defining, together with outer electrode conductors 20b to 20l described below, the first outer electrode 20 having the above-described shape. Similar features and structures apply to the outer electrode conductor 30a, the outer electrode conductor 40a, and the outer electrode conductor 50a.

The dielectric layer DL1 includes, for example, a low-temperature firing ceramic material. The respective dielectric layers, which are described below, include the same or similar material. The outer electrode conductor 20a preferably includes, for example, a sintered compact of Cu particles as a base material, and a Au plated film or a Sn plated film is provided on the surface thereof. The respective outer electrode conductors described below include the same or similar materials and structures.

In the layer LS2, an outer electrode conductor 20b, an outer electrode conductor 30b, an outer electrode conductor 40b, and an outer electrode conductor 50b are provided on the side surfaces of a dielectric layer DL2, and a pattern conductor P1 having a shape in which two rectangles or substantially two rectangles are connected is provided on the first principal surface. The pattern conductor P1 electrically connects the circuit defined in the multilayer body 10 to the first outer electrode 20. The pattern conductor P1 includes one wide end portion connected to the first outer electrode 20, but the shape is not limited thereto.

In addition, in the layer LS2, a via conductor (shown by a dotted line) that extends through the dielectric layer DL2 and is connected to the other end portion of the pattern conductor P1 is provided.

Figure 5:
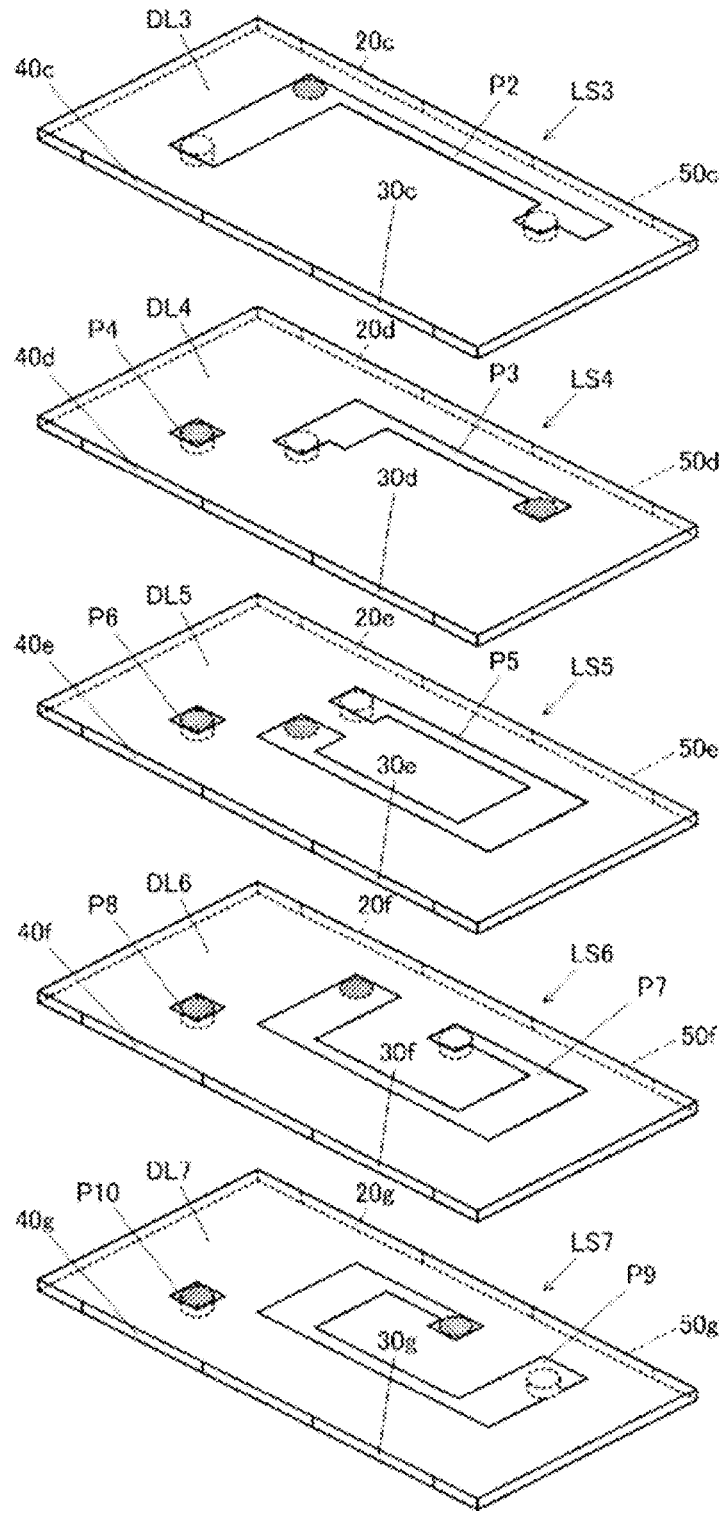
FIG. 5 is an exploded perspective view of an inductor portion LP including a first inductor L1 of the balun 100.

FIG. 5 is an exploded perspective view (layers LS3 to LS7) of the inductor portion LP including the first inductor L1 of the balun 100. In the layer LS3, an outer electrode conductor 20c, an outer electrode conductor 30c, an outer electrode conductor 40c, and an outer electrode conductor 50c are provided on the side surfaces of a dielectric layer DL3, and a pattern conductor P2 is provided on the first principal surface. The pattern conductor P2 has an L-shape, for example, and is a portion of the first inductor L1.

In the layer LS3, two via conductors that extend through the dielectric layer DL3 and are connected to one end portion and the other end portion of the pattern conductor P2 are provided. The via conductor provided in the layer LS2 is connected to the corner portion of the pattern conductor P2. The connection position of the via conductor is shown by a dotted line, and is represented by a circle hatched therein.

In a layer LS4, an outer electrode conductor 20d, an outer electrode conductor 30d, an outer electrode conductor 40d, and an outer electrode conductor 50d are provided on the side surfaces of a dielectric layer DL4, and a pattern conductor P3 and a pattern conductor P4 are provided on the first principal surface. The pattern conductor P3 has an L-shape, for example, and is a portion of the first inductor L1. The pattern conductor P4 has a square or substantially square shape, and relays the connection between the via conductors. However, the pattern conductor P4 is not necessarily provided.

In the layer LS4, a via conductor connected to one end portion of the pattern conductor P3 and a via conductor connected to the pattern conductor P4, each of which extends through the dielectric layer DL4, are provided. Among the via conductors in the layer LS3, the via conductor connected to the one end portion of the pattern conductor P2 is connected to the other end portion of the pattern conductor P3. Further, the via conductor connected to the other end portion of the pattern conductor P2 is connected to the pattern conductor P4.

In a layer LS5, an outer electrode conductor 20e, an outer electrode conductor 30e, an outer electrode conductor 40e, and an outer electrode conductor 50e are provided on the side surfaces of a dielectric layer DL5, and a pattern conductor P5 and a pattern conductor P6 are provided on the first principal surface. The pattern conductor P5 has an angular C-shape, for example, and is a portion of the first inductor L1. The pattern conductor P6 has a shape and a function similar to those of the pattern conductor P4.

In the layer LS5, a via conductor connected to one end portion of the pattern conductor P5 and a via conductor connected to the pattern conductor P6, each of which extends through the dielectric layer DL5, are provided. Among the via conductors in the layer LS4, the via conductor connected to the one end portion of the pattern conductor P3 is connected to the other end portion of the pattern conductor P5. Further, the via conductor connected to the pattern conductor P4 is connected to the pattern conductor P6.

In a layer LS6, an outer electrode conductor 20f, an outer electrode conductor 30f, an outer electrode conductor 40f, and an outer electrode conductor 50f are provided on the side surfaces of a dielectric layer DL6, and a pattern conductor P7 and a pattern conductor P8 are provided on the first principal surface. The pattern conductor P7 has an angular C-shape, for example, and is a portion of the first inductor L1. The pattern conductor P8 has a shape and a function similar to those of the pattern conductor P4.

In the layer LS6, a via conductor connected to one end portion of the pattern conductor P7 and a via conductor connected to the pattern conductor P8, each of which extends through the dielectric layer DL6, are provided. Among the via conductors in the layer LS5, the via conductor connected to the one end portion of the pattern conductor P5 is connected to the other end portion of the pattern conductor P7. Further, the via conductor connected to the pattern conductor P6 is connected to the pattern conductor P8.

In the layer LS7, an outer electrode conductor 20g, an outer electrode conductor 30g, an outer electrode conductor 40g, and an outer electrode conductor 50g are provided on the side surfaces of a dielectric layer DL7, and a pattern conductor P9 and a pattern conductor P10 are provided on the first principal surface. The pattern conductor P9 has an angular C-shape, for example, and is a portion of the first inductor L1. The pattern conductor P10 has a shape and a function similar to those of the pattern conductor P4.

In the layer LS7, a via conductor connected to one end portion of the pattern conductor P9 and a via conductor connected to the pattern conductor P10, each of which extends through the dielectric layer DL7, are provided. Among the via conductors in the layer LS6, the via conductor connected to the one end portion of the pattern conductor P7 is connected to the other end portion of the pattern conductor P9. Further, the via conductor connected to the pattern conductor P8 is connected to the pattern conductor P10.

Figure 6:
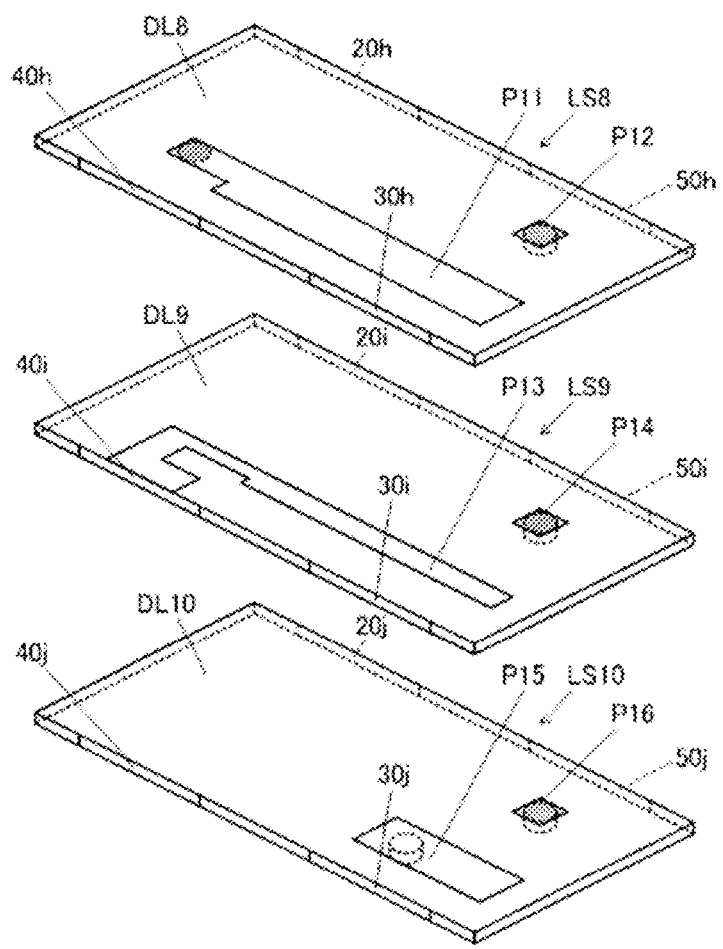
FIG. 6 is an exploded perspective view of a capacitor portion including a first capacitor and a second capacitor C2 of the balun 100.

FIG. 6 is an exploded perspective view (layers LS8 to LS10) of the capacitor portion CP including the first capacitor C1 and the second capacitor C2 of the balun 100. In the layer LS8, an outer electrode conductor 20h, an outer electrode conductor 30h, an outer electrode conductor 40h, and an outer electrode conductor 50h are provided on the side surfaces of a dielectric layer DL8, and a pattern conductor P11 and a pattern conductor P12 are provided on the first principal surface. The pattern conductor P11 has an I-shape, for example, and corresponds to one electrode of the first capacitor C1. The pattern conductor P12 has a shape and a function similar to those of the pattern conductor P4.

In the layer LS8, a via conductor that extends through the dielectric layer DL8 and is connected to the pattern conductor P12 is provided. Among the via conductors in the layer LS7, the via conductor connected to the one end portion of the pattern conductor P9 is connected to the pattern conductor P12. Further, the via conductor connected to the pattern conductor P10 is connected to one end portion of the pattern conductor P11.

In a layer LS9, an outer electrode conductor 20i, an outer electrode conductor 30i, an outer electrode conductor 40i, and an outer electrode conductor 50i are provided on the side surfaces of a dielectric layer DL9, and a pattern conductor P13 and a pattern conductor P14 are provided on the first principal surface. The pattern conductor P13 has an L-shape, for example, and defines and functions as both the other electrode of the first capacitor C1 and the other electrode of the second capacitor C2.

That is, the pattern conductor P13 electrically connects the first capacitor C1 and the second capacitor C2, and electrically connects the circuit provided in the multilayer body 10 to the third outer electrode 40. The pattern conductor P14 has a shape and a function similar to those of the pattern conductor P4.

In the layer LS9, a via conductor that extends through the dielectric layer DL9 and is connected to the pattern conductor P14 is provided. The via conductor of the above-described layer LS8 is connected to the pattern conductor P14.

In a layer LS10, an outer electrode conductor 20j, an outer electrode conductor 30j, an outer electrode conductor 40j, and an outer electrode conductor 50j are provided on the side surfaces of a dielectric layer DL10, and a pattern conductor P15 and a pattern conductor P16 are provided on the first principal surface. The pattern conductor P15 has an I-shape, for example, and corresponds to one electrode of the second capacitor C2. The pattern conductor P16 has a shape and a function similar to those of the pattern conductor P4.

In the layer LS10, a via conductor connected to one end portion of the pattern conductor P15 and a via conductor connected to the pattern conductor P16, each of which extends through the dielectric layer DL10, are provided. The via conductor of the above-described layer LS9 is connected to the pattern conductor P16.

Figure 7:
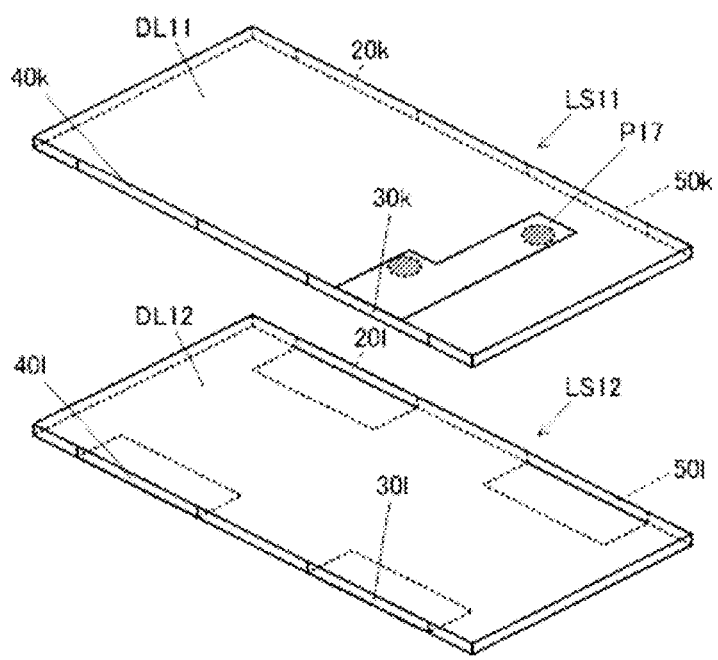
FIG. 7 is an exploded perspective view of a second outer layer portion OP2 of the balun 100.

FIG. 7 is an exploded perspective view (layer LS11 and layer LS12) of the second outer layer portion OP2 of the balun 100. In the layer LS11, an outer electrode conductor 20k, an outer electrode conductor 30k, an outer electrode conductor 40k, and an outer electrode conductor 50k are provided on the side surfaces of a dielectric layer DL11, and a pattern conductor P17 having a shape in which two rectangles or substantially two rectangles are connected is provided on the first principal surface. The pattern conductor P17 electrically connects the circuit provided in the multilayer body 10 to the second outer electrode 30. The pattern conductor P17 has one wide end portion connected to the third outer electrode 40, but the shape is not limited thereto.

Among the via conductors in the above-described layer LS10, the via conductor connected to the one end portion of the pattern conductor P15 is connected to the one end portion of the pattern conductor P17 (the end portion adjacent to or in a vicinity of the second outer electrode 30). Further, the via conductor connected to the pattern conductor P16 is connected to the other end portion of the pattern conductor P17.

The layer LS12 is provided with an outer electrode conductor 20l, an outer electrode conductor 30l, an outer electrode conductor 40l, and an outer electrode conductor 50l on the second principal surface and the side surfaces of a dielectric layer DL12.

As described above, in the balun 100, the first capacitor C1, the second capacitor C2, and the first inductor L1 are provided in the multilayer body 10. Further, the first outer electrode 20, the second outer electrode 30, and the third outer electrode 40 are electrically connected to the circuit defined by the capacitors and the inductor. As described above, the first outer electrode 20 is the unbalanced signal electrode. The second outer electrode 30 is the first balanced signal electrode. The third outer electrode 40 is the second balanced signal electrode.

The first capacitor C1 and the second capacitor C2 are electrically connected in series between the first outer electrode 20 and the second outer electrode 30. Further, the first inductor is electrically connected in parallel to the first capacitor C1 and the second capacitor C2 electrically connected in series. The third outer electrode 40 is electrically connected to a node between the first capacitor C1 and the second capacitor C2.

That is, in the balun 100, the electromagnetic-field coupling between inductors does not occur in the multilayer body 10. Therefore, the balun 100 is able to be significantly reduce or prevent an increase in insertion loss.

Further, when viewed from the lamination direction of the multilayer body, inductors are not provided adjacent to or in a vicinity of each other in the multilayer body 10. Therefore, the balun 100 is able to be significantly reduce or prevent an increase in a mounting area while also significantly reducing or preventing an increase in insertion loss.

In the balun 100, the first capacitor C1 is provided between the first inductor L1 and the second capacitor C2 when viewed from a direction orthogonal or substantially orthogonal to the lamination direction of the dielectric layers DL1 to DL12. Further, when viewed from the lamination direction of the dielectric layers DL1 to DL12, the first inductor L1 and at least a portion of the first capacitor C1 overlap each other. In addition, the first capacitor C1 and at least a portion of the second capacitor C2 overlap each other.

Specifically, in the balun 100, the pattern conductor P9 defining the first inductor L1 overlaps a portion of the pattern conductor P11, which is one electrode of the first capacitor C1. Further, a portion of the pattern conductor P11, which is the one electrode of the first capacitor C1, and a portion of the pattern conductor P13, which is the other electrode of the second capacitor C2, overlap each other. Therefore, the first capacitor C1 is able to be significantly reduce or prevent the electromagnetic-field coupling between the first inductor L1 and the second capacitor C2.

In the balun 100, the second capacitor C2 contributes to the impedance matching. Therefore, since the electromagnetic-field coupling between the first inductor L1 and the second capacitor C2 is significantly reduced or prevented, the deviation from a designed impedance matching is able to be significantly reduced or prevented.

Experimental Example

Figure 8A:
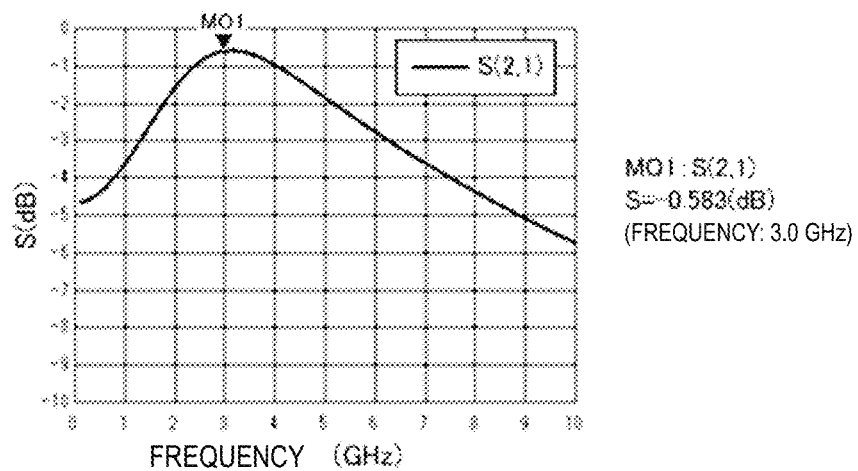
FIGS. 8A and 8B are graphs showing a change in insertion loss with respect to the frequency of the balun 100 and a Smith chart showing a change in impedance with respect to the frequency of the balun 100.
Figure 8B:
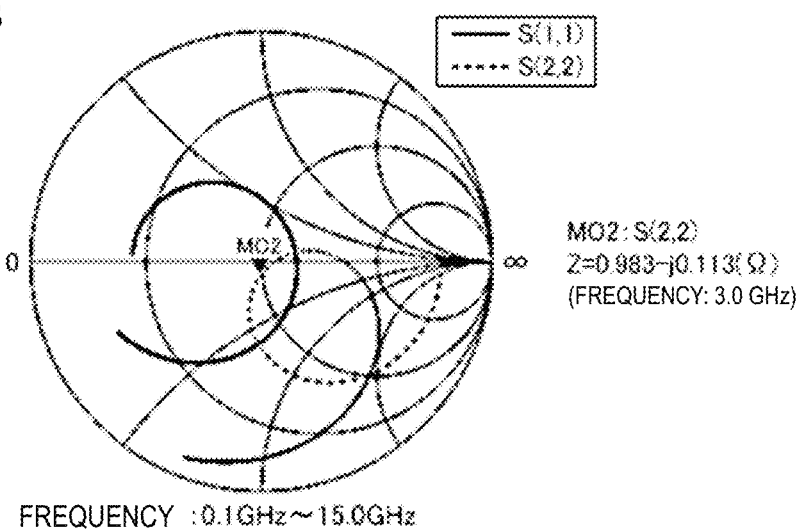

FIGS. 8A and 8B are graphs showing a change in insertion loss with respect to the frequency of the balun 100 and a Smith chart describing a change in impedance with respect to the frequency of the balun 100. The experimental examples described above are calculation results determined when simulation is performed with the capacitance, the inductance, and the real part and the imaginary part of the impedance of each signal port with respect to the ground as appropriate values. The simulations were carried out in the frequency range from about 0.1 GHz to about 15.0 GHz.

As shown in FIG. 8A, at the frequency of about 3.0 GHz, S(2,1) is about −0.583 (dB) in this simulation. That is, in the balun 100, an increase in insertion loss is able to be significantly reduced or prevented.

In addition, as described in FIG. 8B, the impedance at the frequency of about 3.0 GHz is about 0.983-j0.113 (Ω) in this simulation. That is, the impedance matching is sufficient in the balun 100.

Second Preferred Embodiment of Balun

A balun 100A, according to a second preferred embodiment of the present invention, is described with reference to FIG. 10.

Equivalent Circuit and Structure of Balun

Figure 9:
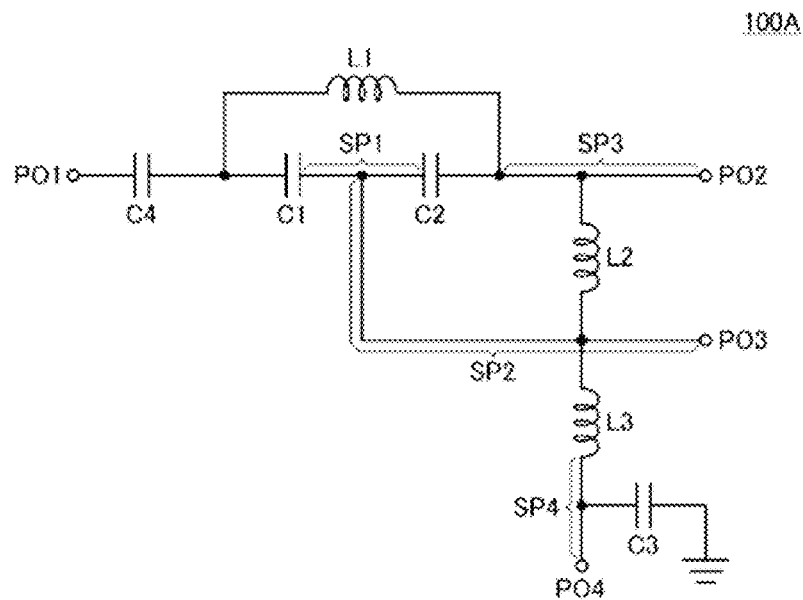
FIG. 9 is an equivalent circuit diagram of a balun 100A according to a second preferred embodiment of the present invention.

FIG. 9 is an equivalent circuit diagram of the balun 100A. The balun 100A further includes, in addition to the above-described circuitry and features of the balun 100, a third capacitor C3, a fourth capacitor C4, a second inductor L2, a third inductor L3, and a DC power supply port PO4.

The second inductor L2 is electrically connected between the first balanced signal port and the second balanced signal port described above. The third inductor L3 is electrically connected between the second balanced signal port and the DC power supply port PO4.

The third capacitor C3 is electrically connected between the ground and the node between the third inductor L3 and the DC power supply port PO4. The fourth capacitor C4 is electrically connected between the unbalanced signal port PO1 and the node between the first capacitor C1 and the first inductor L1. The fourth capacitor C4 is included as an element for impedance matching of the balun 100A. However, the fourth capacitor C4 is not necessarily provided.

The second inductor L2, the third inductor L3, the third capacitor C3, and the DC power supply port PO4 define a DC voltage supply circuit in the balun 100A. When the balun 100A includes the DC voltage supply circuit, it is not necessary to separately provide, for example, a DC voltage supply circuit to drive an IC electrically connected to the balun 100A on a circuit board of an electronic device. Accordingly, the size of the electronic device is able to be significantly reduced.

The second inductor L2, the third inductor L3, and the third capacitor C3, may also define and function as an element that provides impedance matching of the balun 100A, similarly to the fourth capacitor C4 described above. Accordingly, it is not necessary to further provide an element to provide impedance matching, and thus the number of components is able to be significantly reduced. Accordingly, the size of the balun 100A is able to be further reduced.

In addition, although the impedance matching is performed by the fourth capacitor C4 in the balun 100A, the impedance matching may be performed by an impedance matching circuit including an inductor and a capacitor.

In the balun 100A, in addition to the circuitry and features of the balun 100, the above-described respective capacitors and respective inductors, a DC power supply input electrode (not shown), and a ground electrode (not shown), are further provided by pattern conductors, or pattern conductors and via conductors.

The second inductor L2 is electrically connected between the second outer electrode 30 (see FIG. 2) and the second balanced signal port. The third inductor L3 is electrically connected between the second balanced signal port and the DC power supply input electrode. The third capacitor C3 is electrically connected between the ground electrode and the node between the third inductor L3 and the DC power supply input electrode.

Also in the balun 100A, the first capacitor C1 is able to be provided between the first inductor L1 and the second capacitor C2 when viewed from a direction orthogonal or substantially orthogonal to the lamination direction of the dielectric layers DL1 to DL12. Further, when viewed in the lamination direction of the dielectric layers DL1 to DL12, the first inductor L1 and at least a portion of the first capacitor C1 may overlap each other. Further, the first capacitor C1 and at least a portion of the second capacitor C2 may overlap each other.

More specifically, also in the balun 100A, the pattern conductor P9 defining the first inductor L1 and a portion of the pattern conductor P11 as one electrode of the first capacitor C1 may overlap each other. In addition, a portion of the pattern conductor P11 which is the one electrode of the first capacitor C1 and a portion of the pattern conductor P13 which is the other electrode of the second capacitor C2 may overlap each other. Therefore, the first capacitor C1 is able to be significantly reduce or prevent the electromagnetic-field coupling between the first inductor L1 and the second capacitor C2.

In addition, in the balun 100A, the first capacitor C1 is able to be provided between the first inductor L1 and the second inductor L2 when viewed from the lamination direction of the dielectric layers DL1 to DL12. Accordingly, the electromagnetic-field coupling between the first inductor L1 and the second inductor L2 is able to be significantly reduced or prevented.

Third Preferred Embodiment of Balun

A balun 100B, according to a third preferred embodiment of the present invention, is described with reference to FIG. 10.

Equivalent Circuit of Balun

Figure 10:
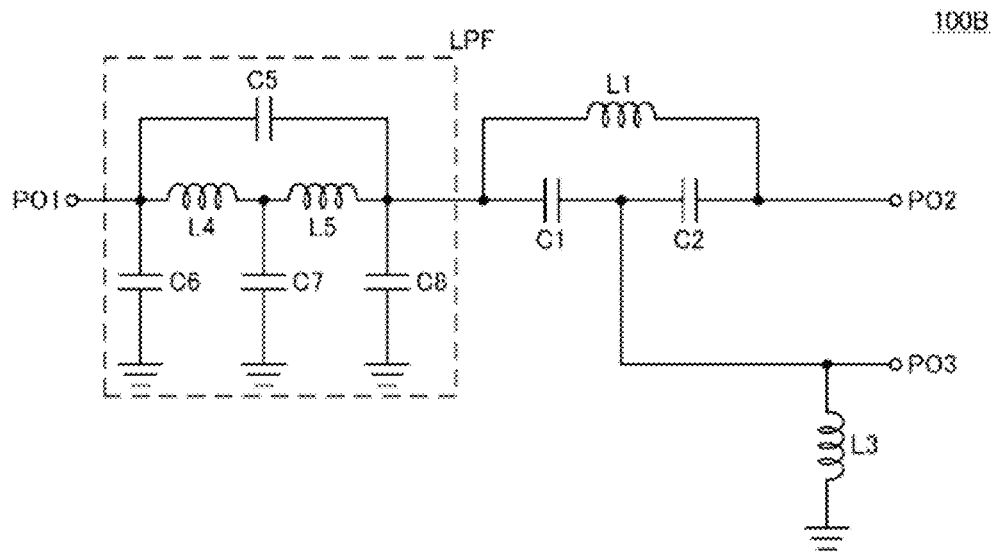
FIG. 10 is an equivalent circuit diagram of a balun 100B according to a third preferred embodiment of the present invention.
Figure 11:
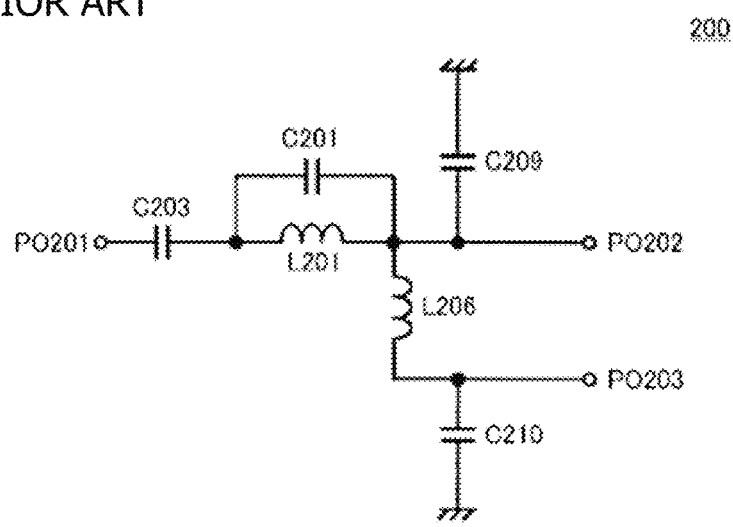
FIG. 11 is an equivalent circuit diagram of a balun 200 according to the related art.
Figure 12:
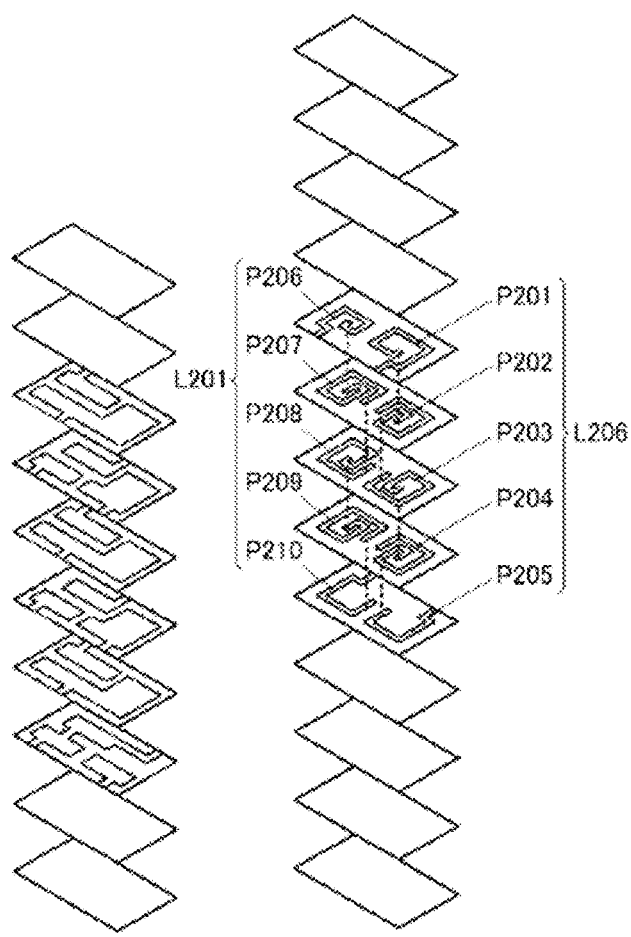
FIG. 12 is an exploded perspective view of the balun 200.

FIG. 10 is an equivalent circuit diagram of a balun 100B. The balun 100B further includes, in addition to the circuitry and features of the balun 100 described above, a fifth capacitor C5, a sixth capacitor C6, a seventh capacitor C7, an eighth capacitor C8, a third inductor L3, a fourth inductor L4, and a fifth inductor L5.

The third inductor L3 is electrically connected between the second balanced signal port and ground described above.

The fifth capacitor C5, the sixth capacitor C6, the seventh capacitor C7, the eighth capacitor C8, the fourth inductor L4, and the fifth inductor L5 are electrically connected to define a low pass filter LPF.

In FIG. 10, the fourth inductor L4 and the fifth inductor L5 are electrically connected in series, and the fifth capacitor C5 is electrically connected in parallel to the fourth inductor L4 and the fifth inductor L5 electrically connected in series. The sixth capacitor C6 is electrically connected between the ground and the node between the fourth inductor L4 and the fifth capacitor C5. The seventh capacitor C7 is electrically connected between the ground and the node between the fourth inductor L4 and the fifth inductor L5. Further, the eighth capacitor C8 is electrically connected between the ground and the node between the fifth inductor L5 and the fifth capacitor C5.

The low pass filter LPF is electrically connected between the unbalanced signal port PO1 and the node between the first capacitor C1 and the first inductor L1. The circuitry and features of the low pass filter LPF is not limited to the above-described circuitry and features.

In the balun 100B described above, the common mode characteristics are able to be significantly improved and the harmonic wave is able to be attenuated.

Although the low pass filter LPF is provided in the balun 100B, at least one of a low pass filter, a band pass filter, and a high pass filter may be provided in accordance with a desired signal to be attenuated.

In addition, in the balun 100B, although impedance matching is performed by the third inductor L3, the impedance matching may be performed by an impedance matching circuit including an inductor and a capacitor.

The preferred embodiments described herein are able to be combined and implemented as long as they are not contradictory to each other. The preferred embodiments described in this specification are provided as examples, and the present invention is not limited to the above-described preferred embodiments and modifications. That is, the scope of the present invention is provided by the claims, and all modifications within the meaning and scope equivalent to the scope of the claims are included in the scope of the present invention. In addition, various applications and modifications are able to be implemented by those skilled in the art.

Examples of the balun to which the present invention according to the preferred embodiments include, but are not limited to, laminated baluns provided by co-firing a low-temperature fired ceramics, a pattern conductor, and a via conductor, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A balun, comprising:
a first capacitor;
a second capacitor;
a first inductor;
an unbalanced signal port;
a first balanced signal port;
a second balanced signal port;
a multilayer body including dielectric layers that are laminated;
pattern conductors provided between the dielectric layers; and
via conductors extending through the dielectric layers; wherein
the first capacitor and the second capacitor are electrically connected in series between the unbalanced signal port and the first balanced signal port, the first inductor is electrically connected in parallel to the first capacitor and the second capacitor electrically connected in series;
the second balanced signal port is electrically connected to a node between the first capacitor and the second capacitor;
the first capacitor, the second capacitor, the first inductor, the unbalanced signal port, the first balanced signal port, and the second balanced signal port are defined by the pattern conductors, or the pattern conductors and the via conductors; and
the first capacitor is provided between the first inductor and the second capacitor when viewed from a direction orthogonal or substantially orthogonal to a lamination direction of the dielectric layers.

2. A balun, comprising:
a first capacitor;
a second capacitor;
a third capacitor;
a first inductor;
a second inductor;
a third inductor;
an unbalanced signal port;
a first balanced signal port;
a second balanced signal port; and
a DC power supply port; wherein
the first capacitor and the second capacitor are electrically connected in series between the unbalanced signal port and the first balanced signal port, the first inductor is electrically connected in parallel to the first capacitor and the second capacitor electrically connected in series;
the second balanced signal port is electrically connected to a node between the first capacitor and the second capacitor;
the second inductor is electrically connected between the first balanced signal port and the second balanced signal port;
the third inductor is electrically connected between the second balanced signal port and the DC power supply port; and
the third capacitor is electrically connected between a ground and a node between the third inductor and the DC power supply port.

3. The balun according to claim 2, wherein the balun includes:
a multilayer body including dielectric layers that are laminated;
pattern conductors provided between the dielectric layers; and
via conductors extending through the dielectric layers; and
the first capacitor, the second capacitor, the first inductor, the unbalanced signal port, the first balanced signal port, and the second balanced signal port are defined by the pattern conductors, or the pattern conductors and the via conductors.

4. The balun according to claim 2, wherein the balun includes:
a multilayer body including dielectric layers that are laminated;
pattern conductors provided between the dielectric layers; and
via conductors extending through the dielectric layers; and
the first capacitor, the second capacitor, the first inductor, the unbalanced signal port, the first balanced signal port, the second balanced signal port, the third capacitor, the second inductor, the third inductor, the DC power supply port, and the ground are defined by the pattern conductors, or the pattern conductors and the via conductors.

5. The balun according to claim 4, wherein the first capacitor is provided between the first inductor and the second capacitor when viewed from a direction orthogonal or substantially orthogonal to a lamination direction of the dielectric layers.

6. The balun according to claim 5, wherein the first capacitor is provided between the first inductor and the second inductor when viewed from the direction orthogonal or substantially orthogonal to the lamination direction of the dielectric layers.

7. The balun according to claim 4, wherein the first inductor and at least a portion of the first capacitor overlap each other when viewed from a lamination direction of the dielectric layers.

8. The balun according to claim 4, wherein the first capacitor and at least a portion of the second capacitor overlap each other when viewed from a lamination direction of the dielectric layers.

9. The balun according to claim 2, further comprising a fourth capacitor electrically connected between the unbalanced signal port and a node between the first capacitor and the first inductor.

10. The balun according to claim 2, further comprising a low pass filter electrically connected between the unbalanced signal port and a node between the first capacitor and the first inductor.

11. The balun according to claim 10, wherein the low pass filter includes at least a fourth capacitor and a fourth inductor.

12. A balun, comprising:
a first capacitor;
a second capacitor;
a first inductor;

an unbalanced signal port;
a first balanced signal port;
a second balanced signal port;
a multilayer body including dielectric layers that are laminated;
pattern conductors between the dielectric layers; and
via conductors extending through the dielectric layers; wherein
the first capacitor and the second capacitor are electrically connected in series between the unbalanced signal port and the first balanced signal port, the first inductor is electrically connected in parallel to the first capacitor and the second capacitor electrically connected in series;
the second balanced signal port is electrically connected to a node between the first capacitor and the second capacitor;
the first capacitor, the second capacitor, the first inductor, the unbalanced signal port, the first balanced signal port, and the second balanced signal port are defined by the pattern conductors, or the pattern conductors and the via conductors; and
the first inductor and at least a portion of the first capacitor overlap each other when viewed from a lamination direction of the dielectric layers.

13. The balun according to claim 12, wherein at least a portion of each of the first outer electrode, the second outer electrode, and the third outer electrode is provided on a same outer surface of the multilayer body.

14. The balun according to claim 12, wherein at least a portion of the first outer electrode is provided on an outer surface of the multilayer body that does not include the second outer electrode and the third outer electrode.

15. The balun according to claim 12, wherein
the unbalanced signal port is defined by a first outer electrode of the multilayer body;
the first balanced signal port is defined by a second outer electrode of the multilayer body; and
the second balanced signal port is defined by a third outer electrode of the multilayer body.

16. The balun according to claim 15, further comprising:
a fourth outer electrode provided on a surface of the multilayer body; wherein
the fourth outer electrode is a ground electrode of the balun.

17. A balun, comprising:
a first capacitor;
a second capacitor;
a first inductor;
an unbalanced signal port;
a first balanced signal port;
a second balanced signal port;
a multilayer body including dielectric layers that are laminated;
pattern conductors provided between the dielectric layers; and
via conductors extending through the dielectric layers; wherein
the first capacitor and the second capacitor are electrically connected in series between the unbalanced signal port and the first balanced signal port, the first inductor is electrically connected in parallel to the first capacitor and the second capacitor electrically connected in series;
the second balanced signal port is electrically connected to a node between the first capacitor and the second capacitor;
the first capacitor, the second capacitor, the first inductor, the unbalanced signal port, the first balanced signal port, and the second balanced signal port are defined by the pattern conductors, or the pattern conductors and the via conductors;
the unbalanced signal port is defined by a first outer electrode of the multilayer body;
the first balanced signal port is defined by a second outer electrode of the multilayer body;
the second balanced signal port is defined by a third outer electrode of the multilayer body;
a fourth outer electrode is provided on a surface of the multilayer body; and
the fourth outer electrode is not electrically connected to any circuit included in the multilayer body.

* * * * *